(12) United States Patent
Zhang et al.

(10) Patent No.: US 8,525,707 B1
(45) Date of Patent: Sep. 3, 2013

(54) SYSTEMS AND METHODS FOR DUAL BINARY AND NON-BINARY DECODING PROCESSING

(75) Inventors: Fan Zhang, Milpitas, CA (US); Chung-Li Wang, San Jose, CA (US); Shaohua Yang, San Jose, CA (US); Haitao Xia, San Jose, CA (US)

(73) Assignee: LSI Corporation, San Jose, CA (US)

( * ) Notice: Subject to any disclaimer, the term of this patent is extended or adjusted under 35 U.S.C. 154(b) by 0 days.

(21) Appl. No.: 13/474,672

(22) Filed: May 17, 2012

(51) Int. Cl.
*H03M 13/00* (2006.01)

(52) U.S. Cl.
USPC ............ 341/94; 341/50; 341/51; 341/107; 714/752; 714/776; 714/763; 714/777

(58) Field of Classification Search
USPC ............ 341/50, 51, 94, 107; 714/752, 776, 714/763, 777
See application file for complete search history.

(56) References Cited

U.S. PATENT DOCUMENTS

| | | | |
|---|---|---|---|
| 5,392,362 A * | 2/1995 | Kimura et al. ............ | 382/176 |
| 5,701,314 A | 12/1997 | Armstrong | |
| 5,712,861 A | 1/1998 | Inoue | |
| 6,438,717 B1 | 8/2002 | Butler | |
| 6,657,803 B1 | 12/2003 | Ling | |
| 7,136,244 B1 | 11/2006 | Rothberg | |
| 7,702,989 B2 | 4/2010 | Graef | |
| 7,730,384 B2 | 6/2010 | Graef | |
| 7,738,201 B2 | 6/2010 | Jin | |
| 7,971,125 B2 | 6/2011 | Graef | |
| 7,990,642 B2 | 8/2011 | Lee | |
| 8,176,404 B2 | 5/2012 | Yang | |
| 8,386,880 B2 * | 2/2013 | Savin ............................ | 714/752 |
| 2006/0232454 A1 * | 10/2006 | Cha et al. ................. | 341/51 |
| 2009/0027238 A1 * | 1/2009 | Kong et al. .................... | 341/50 |
| 2010/0211856 A1 * | 8/2010 | Weingarten ............... | 714/777 |
| 2011/0029845 A1 * | 2/2011 | Zhou et al. .................... | 714/776 |
| 2011/0080211 A1 | 4/2011 | Yang | |
| 2011/0161633 A1 | 6/2011 | Xu | |
| 2012/0200954 A1 | 8/2012 | Jin | |
| 2012/0236429 A1 | 9/2012 | Yang | |
| 2013/0019141 A1 * | 1/2013 | Wang et al. .................... | 714/763 |
| 2013/0061112 A1 * | 3/2013 | Chen et al. .................... | 714/758 |
| 2013/0097475 A1 * | 4/2013 | Wang et al. .................... | 714/784 |

OTHER PUBLICATIONS

Olmos et al., "Tree-Structure Expectation Propagation for LDPC Decoding in Erasure Channels", Cornell University Library arXiv:1009.4287 (Sep. 22, 2010).
U.S. Appl. No. 13/459,282, Unpublished (filed Apr. 30, 2012) (Fan Zhang).
U.S. Appl. No. 13/445,858, Unpublished (filed Apr. 12, 2012) (Johnson Yen).
U.S. Appl. No. 13/412,492, Unpublished (filed Mar. 5, 2012) (Shaohua Yang).
U.S. Appl. No. 13/326,367, Unpublished (filed Dec. 15, 2011) (Shaohua Yang).
U.S. Appl. No. 13/372,600, Unpublished (filed Feb. 14, 2012) (Shaohua Yang).
U.S. Appl. No. 13/326,363, Unpublished (filed Dec. 15, 2011) (Fan Zhang).
U.S. Appl. No. 13/465,214, Unpublished (filed May 7, 2012) (Chung-Li Wang).

* cited by examiner

*Primary Examiner* — Linh Nguyen
(74) *Attorney, Agent, or Firm* — Hamilton DeSanctis & Cha

(57) ABSTRACT

The present invention is related to systems and methods for applying two or more data decode algorithms to a processing data set.

20 Claims, 5 Drawing Sheets

SYSTEMS AND METHODS FOR DUAL BINARY AND NON-BINARY DECODING PROCESSING

BACKGROUND OF THE INVENTION

The present invention is related to systems and methods for performing data processing, and more specifically to systems and methods for applying two or more data decode algorithms to a processing data set.

Data processing circuits often include a data detector circuit and a data decoder circuit. In some cases many passes are made through both the data detector circuit and the data decoder circuit in an attempt to recover originally written data. Each pass through both data detector circuit and the data decoder circuit may include a number of iterations through the data decoder circuit. In some cases, the allowed number of iterations through the data decoder and data detector circuits may not yield a correct result.

Hence, for at least the aforementioned reasons, there exists a need in the art for advanced systems and methods for data processing.

BRIEF SUMMARY OF THE INVENTION

The present invention is related to systems and methods for performing data processing, and more specifically to systems and methods for applying two or more data decode algorithms to a processing data set.

Various embodiments of the present invention provide data processing systems that include a sample buffer and a data decoder circuit. The sample buffer is operable to maintain sample set corresponding to a non-binary codeword. The data decoder circuit operable to: apply a non-binary data decode algorithm to a decoder input derived from the sample set to yield a non-binary decoded output; apply a binary data decode algorithm to the decoder input to yield a binary decoded output; determine a first number of unsatisfied checks corresponding to the non-binary decoded output; determine a second number of unsatisfied checks corresponding to the binary decoded output; select one of the binary decoded output and the non-binary decoded output as a selected decoding result based at least in part on the first number of unsatisfied checks and the second number of unsatisfied checks. The data processing system may be implemented, for example, as a storage device or a receiving device. In various cases, the data processing system is implemented as part of an integrated circuit. In one or more cases, the data decoder circuit is a low density parity check circuit.

In some instances of the aforementioned embodiments, the non-binary decoded output is a first non-binary decoded output, and the binary decoded output is a first binary decoded output. IN such instances, the data decoder circuit may further be operable to: re-apply the non-binary data decode algorithm to the decoder input guided by the selected decoding result to yield a second non-binary decoded output; and re-apply the binary data decode algorithm to the decoder input guided by the selected decoding result to yield a second binary decoded output.

In various instances of the aforementioned embodiments, applying the non-binary data decode algorithm utilizes a non-binary H-matrix, and applying the binary data decode algorithm utilizes a binary H-matrix. In some cases, determining the first number of unsatisfied checks corresponding to the non-binary decoded output includes multiplying the non-binary decoded output by the binary H-matrix to yield a binary equivalent. In one or more instances of the aforementioned embodiments, each symbol in the non-binary codeword represents 2N patterns, N is the non-zero number of bits per symbol; and applying the binary data decode algorithm includes treating the non-binary codeword as having single bit symbols. In particular instances of the aforementioned embodiments, the binary decoded output is selected when the second number of unsatisfied checks is less than the first number of unsatisfied checks, and/or the non-binary decoded output is selected when the first number of unsatisfied checks is less than the second number of unsatisfied checks.

Other embodiments of the present invention provide methods that include: applying a non-binary data decode algorithm to a decoder input to yield a non-binary decoded output; applying a binary data decode algorithm to the decoder input to yield a binary decoded output; determining a first number of unsatisfied checks corresponding to the non-binary decoded output; determining a second number of unsatisfied checks corresponding to the binary decoded output; selecting one of the binary decoded output and the non-binary decoded output as a selected decoding result based at least in part on the first number of unsatisfied checks and the second number of unsatisfied checks.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present invention is related to systems and methods for performing data processing, and more specifically to systems and methods for applying two or more data decode algorithms to a processing data set.

Various embodiments of the present invention provide for modifying a data decoding process when delay processing is desired. Such delay processing is done when a reduction in the processing requirements of a data processing circuit occurs, thereby allowing application of otherwise unused processing resources to be used on previously non-converging data sets. Such a reduction in the processing requirements of the data processing circuit may occur, for example, due to a change in tracks when accessing data from a storage medium or an end of transmission of a data transmission device that result in a reduction in the volume of data introduced to the data decoding process. Based upon the disclosure provided herein, one of ordinary skill in the art will recognize a variety of scenarios that may result in under-use of the data processing circuit. It should also be noted that the modified decoding process may be applied in other situations not involving under-use as well.

In particular embodiments of the present invention, the data processing circuit includes a hard decision output circuit that receives data sets processed by a data decoder circuit and buffers the processed data sets prior to transfer to a recipient, and a sample buffer that maintains non-detected/decoded data sets corresponding to the processed data sets. When non-delay or standard processing is ongoing, the hard decision output circuit operates to provide data sets to the recipient in a standard fashion. When standard processing fails to converge, a data set may be maintained in the sample buffer and a current decoded output may be maintained in the hard decision output circuit to await modified processing during delay processing. During delay processing, both binary and non-binary decoding processing are applied to the data set to determine which yields the fewest unsatisfied checks. The result from the binary decoding or non-binary decoding that yields the fewest unsatisfied checks is selected to guide subsequent applications of a data detection algorithm and/or data decode algorithm.

Figure 1:
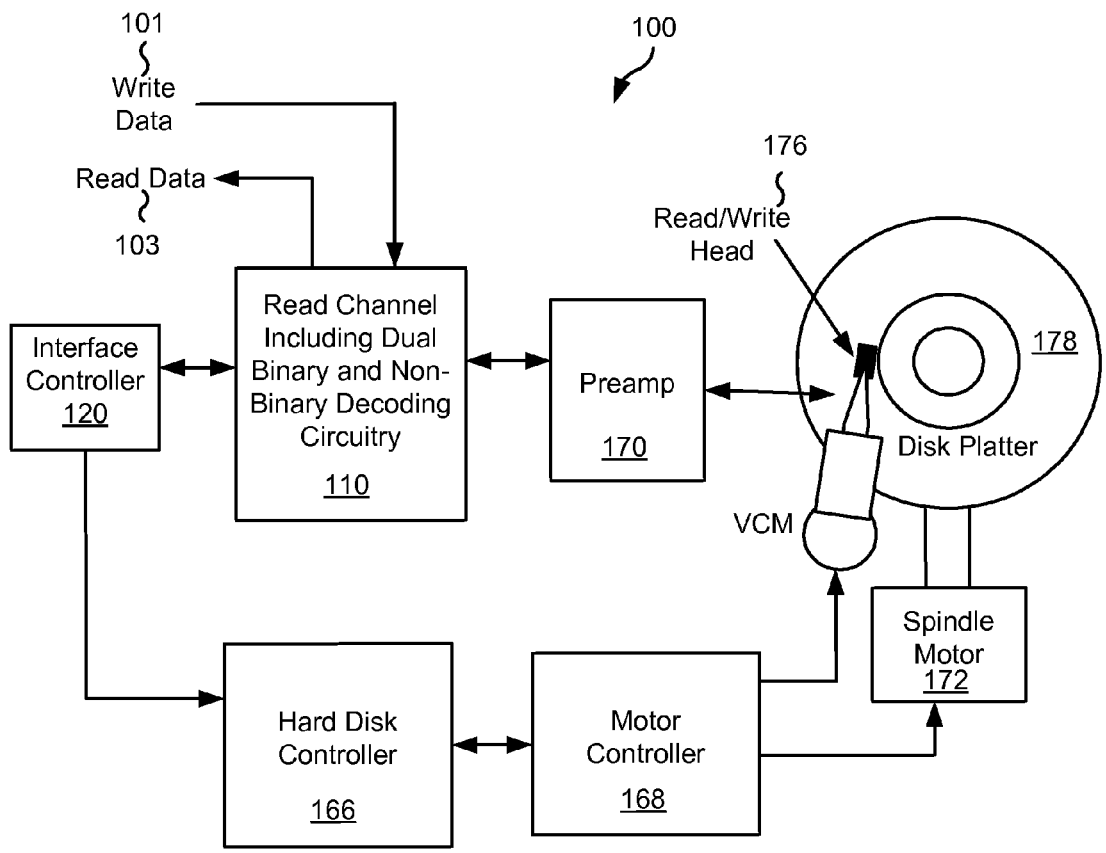
FIG. 1 shows a storage device including a read channel having dual binary and non-binary decoding circuitry in accordance with one or more embodiments of the present invention.

Turning to FIG. 1, a storage system 100 including a read channel circuit 110 having dual binary and non-binary decoding circuitry is shown in accordance with some embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head assembly 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 178 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

During operation, data is sensed from disk platter 178 and processed using a standard processing. Such standard processing may be done using one of a binary data decoding or a non-binary data decoding. In some cases, one or more data sets processed using standard processing fails to converge. In such a case, the non-converging data set is provided as an output with an indication that the non-converging data set is unusable, and the non-converging data set along with the corresponding non-detected/decoded data set are maintained in the data processing system for additional processing during a delay processing period. This delay processing period may be, for example, a period of time when read/write head assembly 176 is moved from a current track to another track. During this delay processing period, the combination of the non-converging data set and the corresponding non-detected/decoded data set are accessed for reprocessing. The reprocessing includes performing both data binary data decoding and non-binary data decoding with selection of the result that exhibits the fewest number of remaining unsatisfied checks for subsequent processing. In some embodiments of the present invention, data processing circuits similar to that discussed below in relation to FIG. 3 may be used, and/or the processing may be done similar to that discussed below in relation to FIGS. 4*a*-4*c*.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

Figure 2:
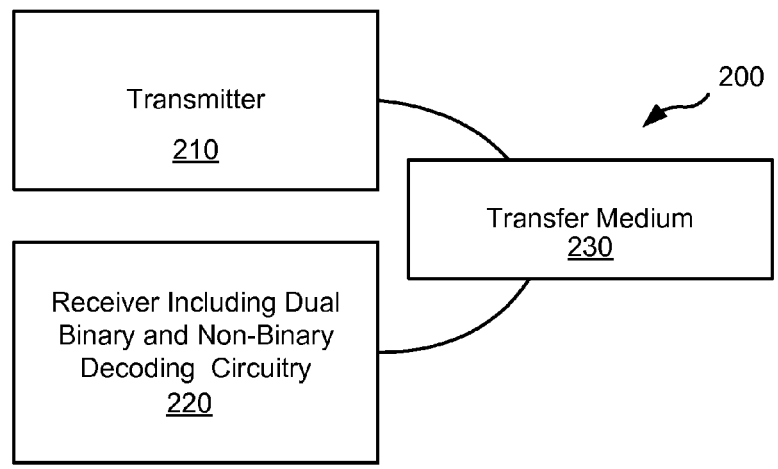
FIG. 2 shows a data transmission device including a receiver having dual binary and non-binary decoding circuitry in accordance with some embodiments of the present invention.

Turning to FIG. 2, a data transmission device 200 including a receiver 220 having dual binary and non-binary decoding circuitry is shown in accordance with some embodiments of the present invention. Data transmission system 200 includes a transmitter 210 that is operable to transmit encoded information via a transfer medium 230 as is known in the art. The encoded data is received from transfer medium 230 by receiver 220.

During operation, data is received by receiver 220 via transfer medium 230 and processed using a standard processing. In some cases, one or more data sets processed using standard processing fails to converge. Such standard processing may be done using one of a binary data decoding or a non-binary data decoding. In such a case, the non-converging data set is provided as an output with an indication that the non-converging data set is unusable, and the non-converging data set along with the corresponding non-detected/decoded data set are maintained in the data processing system for additional processing during a delay processing period. This delay processing period may be, for example, a period of time where data is not being received via transfer medium 230. During this delay processing period, the combination of the non-converging data set and the corresponding non-detected/non-decoded data set are accessed for reprocessing. The reprocessing includes performing both data binary data decoding and non-binary data decoding with selection of the result that exhibits the fewest number of remaining unsatisfied checks for subsequent processing. In some embodiments of the present invention, data processing circuits similar to that discussed below in relation to FIG. 3 may be used, and/or the processing may be done similar to that discussed below in relation to FIGS. 4a-4c.

Figure 3:
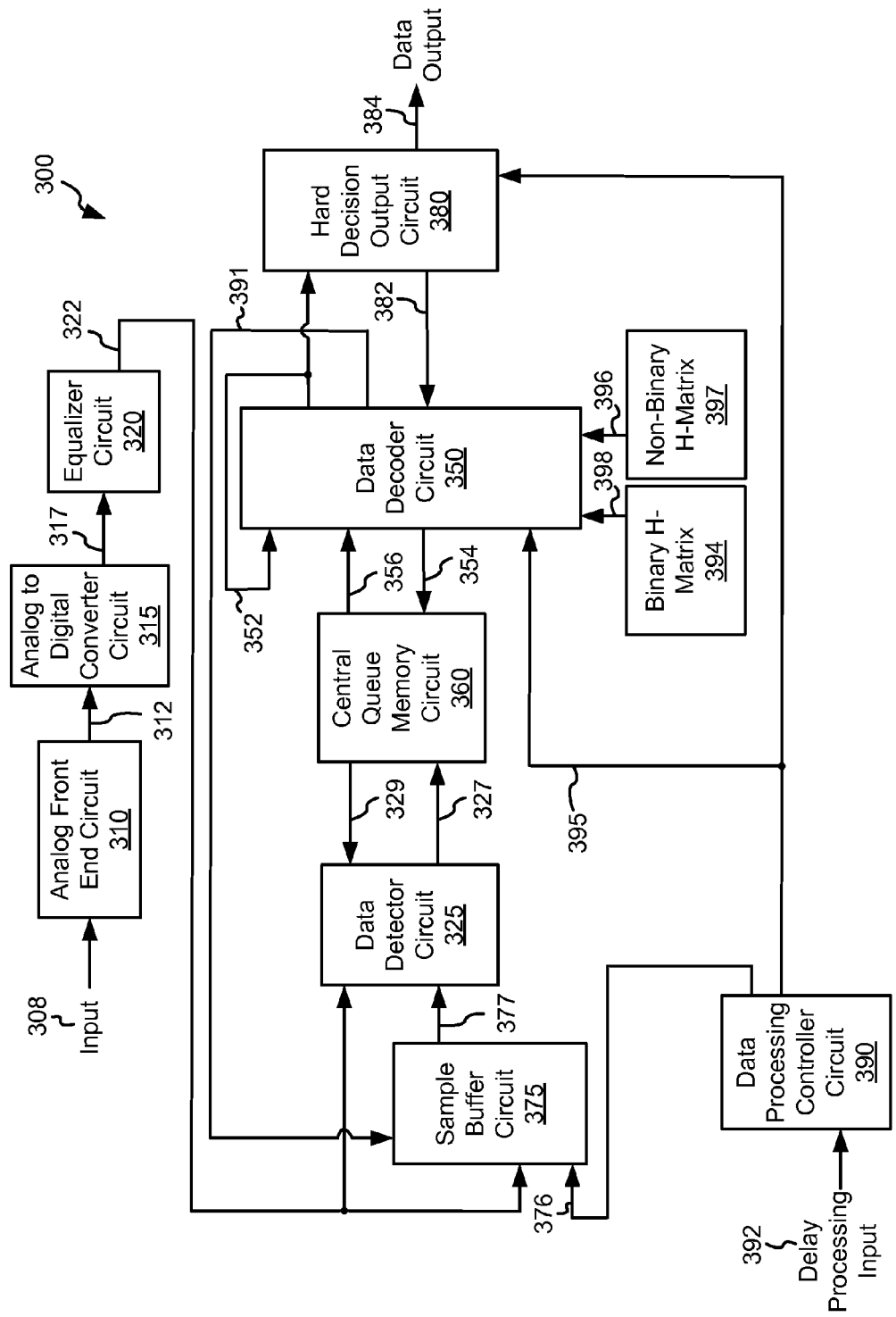
FIG. 3 depicts a data processing circuit having dual binary and non-binary decoding circuitry in accordance with some embodiments of the present invention.

Turning to FIG. 3, a data processing circuit 300 having dual binary and non-binary decoding circuitry is shown in accordance with some embodiments of the present invention. Data processing circuit 300 includes an analog front end circuit 310 that receives an analog input 308. Analog front end circuit 310 processes analog input 308 and provides a processed analog signal 312 to an analog to digital converter circuit 315. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog input 308 is derived from a read/write head assembly (not shown) that is disposed in relation to a storage medium (not shown). In other cases, analog input 308 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 308 may be derived.

Analog to digital converter circuit 315 converts processed analog signal 312 into a corresponding series of digital samples 317. Analog to digital converter circuit 315 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 317 are provided to an equalizer circuit 320. Equalizer circuit 320 applies an equalization algorithm to digital samples 317 to yield an equalized output 322. In some embodiments of the present invention, equalizer circuit 320 is a digital finite impulse response filter circuit as are known in the art.

Equalized output 322 is provided to both a data detector circuit 325 and to a sample buffer circuit 375. Sample buffer circuit 375 stores equalized output 322 as buffered data 377 for use in subsequent iterations through data detector circuit 325. Data detector circuit 325 may be any data detector circuit known in the art that is capable of producing a detected output 327. As some examples, data detector circuit 325 may be, but is not limited to, a Viterbi algorithm detector circuit or a maximum a posteriori detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Detected output 327 may include both hard decisions and soft decisions. The terms "hard decisions" and "soft decisions" are used in their broadest sense. In particular, "hard decisions" are outputs indicating an expected original input value (e.g., a binary '1' or '0', or a non-binary digital value), and the "soft decisions" indicate a likelihood that corresponding hard decisions are correct. Based upon the disclosure provided herein, one of ordinary skill in the art will recognize a variety of hard decisions and soft decisions that may be used in relation to different embodiments of the present invention.

Detected output 327 is provided to a central queue memory circuit 360 that operates to buffer data passed between data detector circuit 325 and data decoder circuit 350. In some cases, central queue memory circuit 360 includes interleaving (i.e., data shuffling) and de-interleaving (i.e., data un-shuffling) circuitry known in the art. When data decoder circuit 350 is available, data decoder circuit 350 accesses detected output 327 from central queue memory circuit 360 as a decoder input 356. Data decoder circuit 350 applies a data decoding algorithm to decoder input 356 in an attempt to recover originally written data. Data decoder circuit 350 is operable to apply a non-binary data decode algorithm to decoder input 356 during standard processing as indicated by de-assertion of a delay processing signal 395. The non-binary data decode algorithm is applied using a non-binary H-matrix 397 providing a matrix output 396 to data decoder circuit 350.

In contrast, data decoder circuit 350 is operable to initially apply a non-binary data decode algorithm to decoder input 356, and subsequently to apply a binary data decode algorithm to decoder input 356 during delay processing. The binary data decode algorithm is applied using a binary H-matrix 394 providing a matrix output 398 to data decoder circuit 350. Such delay processing is indicated by assertion of delay processing signal 395. Delay processing signal 395 is asserted by a data processing controller circuit 390 whenever a delay processing input 392 is asserted, and de-asserted whenever delay processing input 392 is de-asserted. Delay processing input 392 may be asserted when a reduction in the processing requirements of data processing circuit 300 occurs. Such a reduction in the processing requirements may occur, for example, because of a change in tracks when reading a storage medium or an end of transmission of a data transmission device. Based upon the disclosure provided herein, one of ordinary skill in the art will recognize a variety of scenarios that may result in under-use of data processing circuit 300.

During standard processing a resulting non-binary decoded output 352 is provided from data decoder circuit 350 upon completing application of the non-binary data decode algorithm. Similar to detected output 327, decoded output 352 may include both hard decisions and soft decisions. For example, data decoder circuit 350 may be any data decoder circuit known in the art that is capable of applying a decoding algorithm to a received input. Data decoder circuit 350 may be, but is not limited to, a low density parity check (LDPC) decoder circuit or a Reed Solomon decoder circuit as are known in the art. Based upon the disclosure provided herein, one of ordinary skill in the art will recognize a variety of data decoder circuits that may be used in relation to different embodiments of the present invention. Where the original data is recovered (i.e., the data decoding algorithm converges) or a timeout condition occurs, decoded output 352 is stored to a memory included in a hard decision output circuit 380. In turn, hard decision output circuit 380 provides the converged decoded output 352 as a data output 384 to a recipient (not shown). The recipient may be, for example, an interface circuit operable to receive processed data sets. Based upon the disclosure provided herein, one of ordinary skill in the art will recognize a variety of recipients that may be used in relation to different embodiments of the present invention. Where the original data was not recovered (i.e., the data decoding algorithm failed to converge) prior to a timeout condition, decoded output 352 indicates that the data is unusable as is more specifically discussed below, and data output 384 is similarly identified as unusable.

One or more iterations through the combination of data detector circuit 325 and data decoder circuit 350 may be made in an effort to converge on the originally written data set. Processing through both the data detector circuit and the data decoder circuit is referred to as a "global iteration". In contrast, each pass through the data decoder circuit is referred to as a "local iteration". For the first global iteration, data detector circuit 325 applies the data detection algorithm to equalized output 322 without guidance from a decoded output. For subsequent global iterations, data detector circuit 325 applies the data detection algorithm to buffered data 377 as guided by decoded output 352. Decoded output 352 is stored to central queue memory circuit 360 as a decoder output 354, and is provided from central queue memory circuit 360 as a detector input 329.

During each global iteration it is possible for data decoder circuit 350 to make one or more local iterations including application of the data decoding algorithm to decoder input 356. For the first local iteration, data decoder circuit 350 applies the data decoder algorithm without guidance from decoded output 352. For subsequent local iterations, data decoder circuit 350 applies the data decoding algorithm to decoder input 356 as guided by a previous decoded output 352. The number of local iterations allowed may be, for example, ten. Based upon the disclosure provided herein, one of ordinary skill in the art will recognize a variety of different numbers of local iterations that may be allowed in accordance with different embodiments of the present invention. Where the number of local iterations through data decoder circuit 350 exceeds that allowed, but it is determined that at least one additional global iteration during standard processing of the data set is allowed, decoded output 352 is provided back to central queue memory circuit 360 as decoded output 354. Decoded output 354 is maintained in central queue memory circuit 360 until data detector circuit 325 becomes available to perform additional processing.

In contrast, where the number of local iterations through data decoder circuit 350 exceeds that allowed and it is determined that the allowable number of global iterations has been surpassed for the data set and/or a timeout or memory usage calls for termination of processing of the particular data set, standard processing of the data set concludes and the decoded output is provided as data output 352 with an indication that the output is unusable. In such a case where standard processing of the data set has concluded, the un-converged data set (i.e., that provided as data output 352) is stored in the memory of hard decision output circuit 380, and the sample data (i.e., that maintained in sample buffer circuit 375) corresponding to the un-converged data set is maintained in sample buffer circuit 375 for at least a defined period awaiting an indication of delay processing by assertion of a delay processing input 392. In addition, the un-converged data set and the corresponding sample data are identified for delay processing as indicated by assertion of a retain signal 391. Again, delay processing is signaled by the assertion of delay processing input 392.

During delay processing as indicated by assertion of delay processing input 392, one of the sample data sets corresponding to the previously un-converged data sets that remains in sample buffer circuit 375 is accessed as indicated by a control output 376 from data processing controller circuit 390. In addition, data processing controller circuit 390 asserts delay processing signal 395 to data decoder circuit 350 and a hard decision output circuit 380. Data detector circuit 325 re-applies the data detection algorithm to the sample set identified for delay processing and accessed as indicated by control output 376 to yield detected output 327. Detected output 327 is stored to central queue memory circuit 360. Once data decoder circuit 350 becomes available, data decoder circuit 350 accesses detected output 327 from central queue memory circuit 360 as a decoder input 356. Data decoder circuit 350 accesses a corresponding decoded output 382 that was previously stored to the memory of hard decision output circuit 380, and applies the non-binary decoding algorithm to the decoder input 356 guided by decoded output 382 and using matrix output 396 from non-binary H-matrix 397 to yield a non-binary decoded output 352 that is stored to the memory in hard decision output circuit 380 which is largely unused during delay processing. Subsequently, data decoder circuit 350 applies the binary decoding algorithm to the decoder input 356 guided by decoded output 382 and using matrix output 398 from binary H-matrix 394 to yield a binary decoded output 352 that is stored to the memory in hard decision output circuit 380 which, again, is largely unused during delay processing. Of note, the order of applying the binary decoding algorithm and the non-binary decoding algorithm may be reversed in accordance with other embodiments of the present invention.

Data decoder circuit 350 then multiplies the hard decisions corresponding to the non-binary decoded output maintained in the memory of hard decision output circuit 380 by binary H-matrix 394 to yield a number of binary unsatisfied checks. This process of obtaining a binary unsatisfied checks from a non-binary result is known in the art. See e.g., F. J. Macwilliams et al., "The Theory of Error Correction Codes", North-Holland Publishing Company, p. 106. The entirety of the aforementioned reference is incorporated herein by reference for all purposes. This number of binary unsatisfied checks derived from the non-binary decoded output is then compared with the number of unsatisfied checks remaining in the binary decoded output that resulted from applying the binary decoded output. Where the number of binary unsatisfied checks associated with the result of applying the non-binary decoding algorithm are fewer than the number of binary unsatisfied checks associated with the result of applying the binary decoding algorithm, then the result of the non-binary decoding algorithm is retained for use in guiding future data detection and/or data decoding. Otherwise, the result of the binary decoding algorithm is retained for use in guiding future data detection and/or data decoding.

Where another local iteration through data decoder circuit 350 is allowed, the aforementioned process of applying both the binary data decode algorithm and the non-binary data decode algorithm guided by the retained data decode result. This process is repeated until either one of the binary data decode algorithm or the non-binary data decode algorithm converges, a maximum number of local iterations for the current global iteration have completed, or a timeout condition is met. Where a timeout condition is met, an error is reported. The error condition may be met when a maximum number of global iterations have been exhausted. Based upon the disclosure provided herein, one of ordinary skill in the art will recognize a variety of other circumstances in which a timeout condition may be considered to have been met. Where the maximum number of local iterations has been met, the data detection algorithm is applied to the data input from sample buffer circuit 375 guided by the retained result, and the process of decoding begins again. Where either the binary data decode algorithm or the non-binary data decode algorithm converges, the converged result is provided as a data output.

Figure 4A:
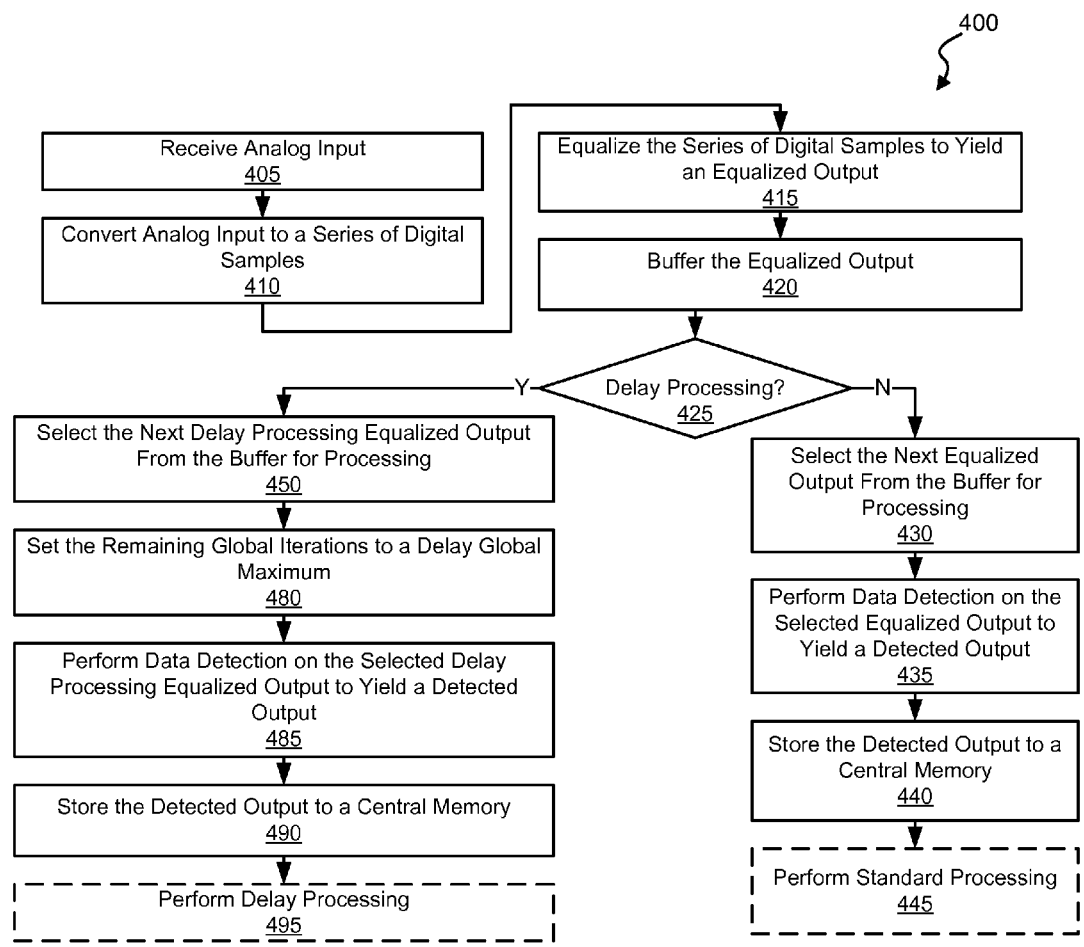
FIGS. 4a-4c are flow diagrams showing a method in accordance with some embodiments of the present invention for dual binary and non-binary decoding processing.
Figure 4B:
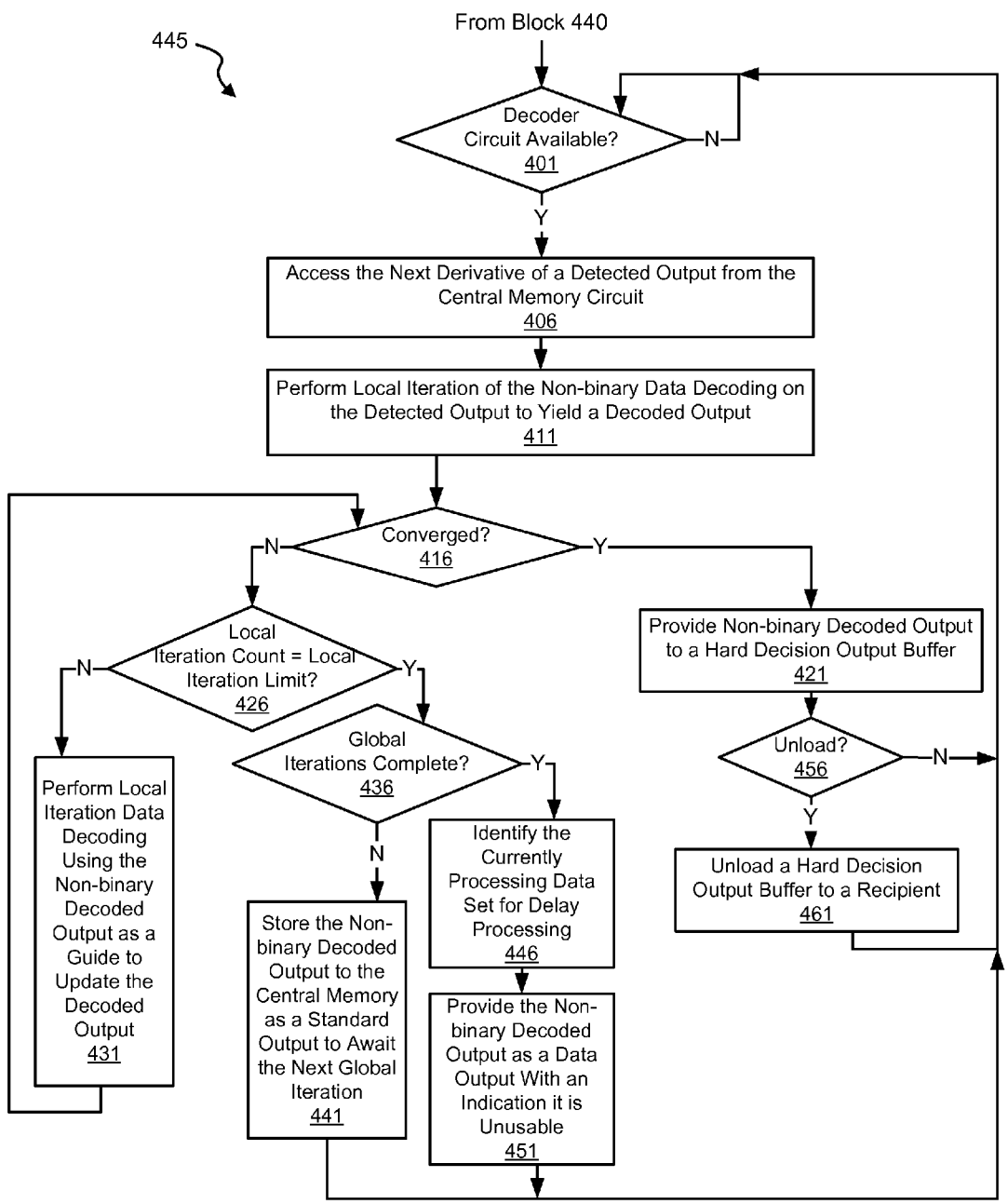
Figure 4C:
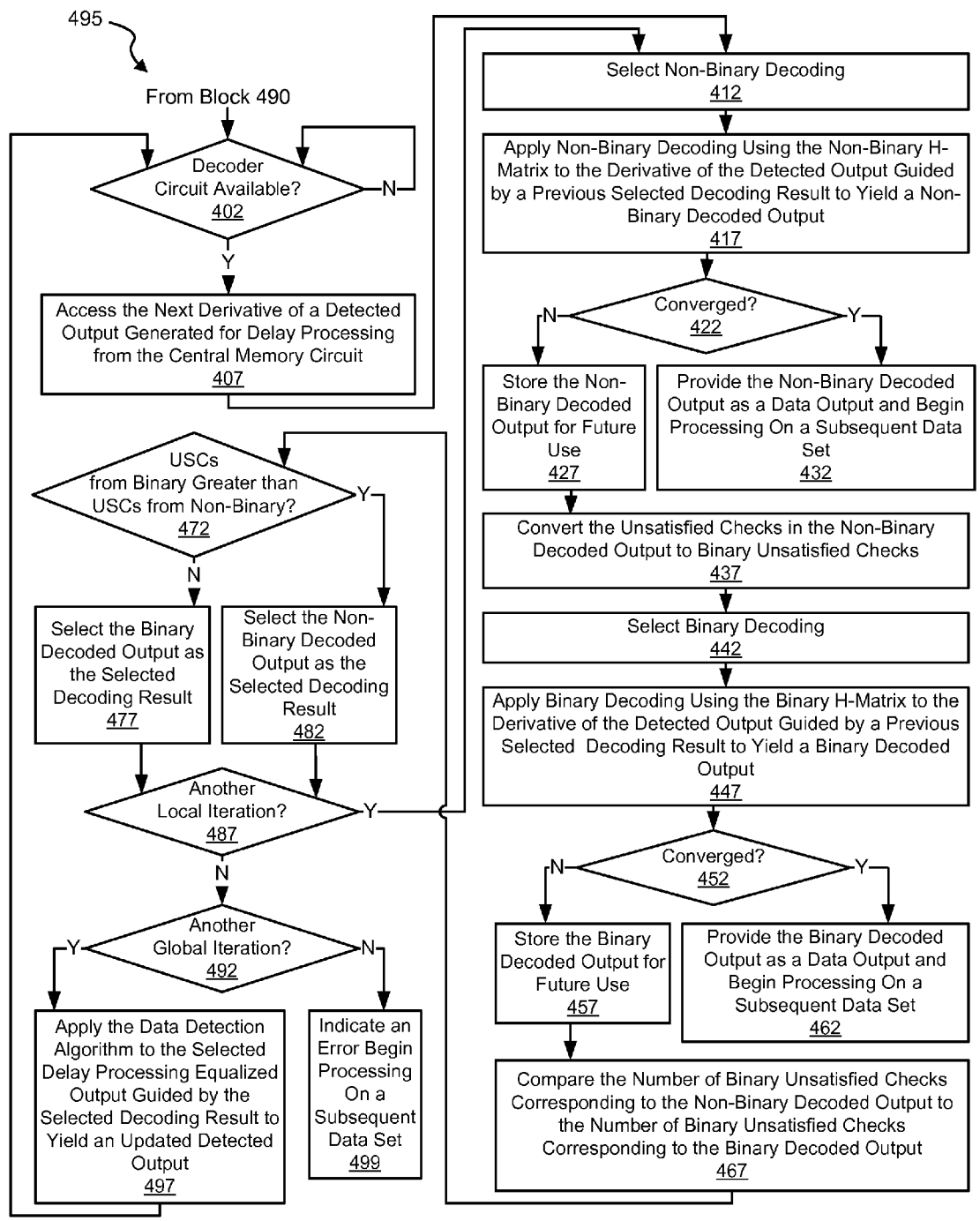

Turning to FIG. 4a-4c, flow diagrams 400, 445, 470 show a method in accordance with some embodiments of the present invention for dual binary and non-binary decoding processing. Turning to FIG. 4a and following flow diagram 400, an analog input is received (block 405). The analog input may be derived from, for example, a storage medium or a data transmission channel. Based upon the disclosure provided herein, one of ordinary skill in the art will recognize a variety of sources of the analog input. The analog input is converted to a series of digital samples (block 410). This conversion may be done using an analog to digital converter circuit or system as are known in the art. Of note, any circuit known in the art that is capable of converting an analog signal into a series of digital values representing the received analog signal may be used. The resulting digital samples are equalized to yield an equalized output (block 415). In some embodiments of the present invention, the equalization is done using a digital finite impulse response circuit as are known in the art. Based upon the disclosure provided herein, one of ordinary skill in the art will recognize a variety of equalizer circuits that may be used in place of such a digital finite impulse response circuit to perform equalization in accordance with different embodiments of the present invention. The equalized output is buffered (block 420).

It is determined whether delay processing is desired (block 425). Such delay processing is selected when a reduction in the processing requirements of a data processing circuit occurs. Such a reduction in the processing requirements may occur, for example, because of a change in tracks when reading a storage medium or an end of transmission of a data transmission device. Based upon the disclosure provided herein, one of ordinary skill in the art will recognize a variety of scenarios that may result in under-use of the data processing circuit.

Where delay processing is not desired (block 425), standard processing is applied. This standard processing includes selecting the next equalized output from the buffer for processing (block 430). This selection may be done in accordance with any data processing circuit selection algorithm known in the art. A data detection algorithm is applied to the selected equalized output to yield a detected output (block 435), and the detected output (or a derivative thereof) is stored to a central memory circuit (block 440). This stored data may then be accessed from the central memory for performance of standard processing (flow diagram 445). This standard processing is done in accordance with flow diagram 445 of FIG. 4b.

Where delay processing is desired (block 425), delay processing is applied. This delay processing includes selecting the next delay processing equalized output from the buffer for processing (block 450). The delay processing equalized output is selected from one or more data sets that failed to converge during standard processing. The number of remaining global iterations to be applied to the currently processing data set is set equal to a delay global maximum (block 480). In some embodiments of the present invention, the delay global maximum is twenty (20). A data detection algorithm is applied to the selected delay processing equalized output to yield a detected output (block 485), and the detected output (or a derivative thereof) is stored to a central memory circuit (block 490). This stored data may then be accessed from the central memory for performance of delay processing (flow diagram 495 of FIG. 4c).

Turning to FIG. 4b, flow diagram 445 shows an implementation of the aforementioned standard processing. Following flow diagram 445, it is determined whether a decoder circuit is available to process a previously stored detected output (block 401). Where the decoder circuit is available (block 401), the next derivative of a detected output is selected for processing and accessed from the central memory circuit (block 406). A first local iteration of a non-binary data decoding algorithm is applied by the data decoder circuit to the selected detected output to yield a non-binary decoded output (block 411).

It is then determined whether the non-binary decoded output converged (i.e., yielded a correct result) (block 416). Where the decoded output converged (block 416), the non-binary decoded output is provided to a hard decision output buffer (block 421). It is then determined whether the hard decision output buffer is ready to be unloaded (block 456). In some cases, the hard decision output buffer is ready to be unloaded when the most recently completed decoded output is the next decoded output after that previously provided as a data output. Where the hard decision output buffer is ready to be unloaded (block 456), all of the continuous decoded outputs maintained in the hard decision output buffer are provided as a data output to a recipient device (block 461). Based upon the disclosure provided herein, one of ordinary skill in the art will recognize a variety of recipient devices that may be used in relation to different embodiments of the present invention.

Alternatively, where the non-binary decoded output failed to converge (block 416), it is determined whether the local iteration count has exceeded a local iteration limit (block 426). This local iteration limit may be, for example, ten (10) local iterations. Where the number of local iterations has not yet been exceeded (block 426), the data decoding algorithm is re-applied to the currently processing data set for a subsequent local iteration guided by the non-binary decoded output to yield an updated non-binary decoded output (block 431). The processes beginning at block 416 are then repeated.

Alternatively, where the number of local iterations for the currently proceeding global iteration have been exceeded (block 426), it is determined if the maximum number of global iterations have already been applied to the currently processing data set (block 436). The number of global iterations may be complete where, for example, a timeout condition has occurred or a memory usage limitation has been exceeded. Where the global iterations are not complete (block 436), the non-binary decoded output is stored to the central memory as a standard output where it awaits processing in a subsequent global iteration (block 441). Alternatively, where the global iterations are complete (block 436), the currently processing data set is identified for delay processing (i.e., processing during a delay processing period) (block 446), and the non-binary decoded output is provided as a data output marked as unusable (block 451).

Turning to FIG. 4c, flow diagram 495 shows an implementation of the aforementioned delay processing. Following flow diagram 495, it is determined whether a decoder circuit is available to process a previously stored detected output (block 402). Where the decoder circuit is available (block 402), the next derivative of a detected output generated for delay processing (i.e., identified for delay processing in block 446) is selected for processing and accessed from the central memory circuit (block 407). Non-binary decoding is selected (block 412), and the non-binary decoding algorithm is applied using a non-binary H-matrix to the derivative of the detected output guided by a previous selected decoding result to yield a non-binary decoded output (block 417). For the first local iteration of the delay processing, the previous selected decoding result is the non-binary decoded output stored in the output buffer from block 451. For subsequent local iterations, the previous selected decoding result is the selected one of either the non-binary decoded output (block 482) or the binary decoded output (block 477).

It is determined whether the non-binary decoded output converged (i.e., yielded a correct result) (block 422). Where the non-binary decoded output converged (block 422), the non-binary decoded output is provided as a data output and another global iteration operating on a subsequent data set begins (block 432). Otherwise, where the non-binary decoded output failed to converge (block 422), the non-binary decoded output is stored for future use (block 427). The non-binary decoded output may be stored, for example, in an unused portion of an output buffer, a central memory buffer, or an input buffer. In addition, the unsatisfied checks in the non-binary decoded output are converted to binary unsatisfied checks (block 437). This may be done, for example, by multiplying the hard decisions corresponding to the non-binary decoded output by a binary H-matrix to yield a number of the binary unsatisfied checks. This process of obtaining a binary unsatisfied checks from a non-binary result is known in the art. See e.g., F. J. Macwilliams et al., "The Theory of Error Correction Codes", North-Holland Publishing Company, p. 106.

Next, binary decoding is selected (block 442), and a binary decoding algorithm is applied using the binary H-matrix to the derivative of the detected output guided by a previous selected decoding result to yield a binary decoded output (block 447). For the first local iteration of the delay processing, the previous selected decoding result is the non-binary decoded output stored in the output buffer from block 451. For subsequent local iterations, the previous selected decoding result is the selected one of either the non-binary decoded output (block 482) or the binary decoded output (block 477). Of note, while flow diagram 495 shows the non-binary decoding (block 417) preceding the binary decoding (block 447), in other embodiments of the present invention, the binary decoding may precede the non-binary decoding. In yet other embodiments of the present invention, the binary decoding may be done in parallel with the non-binary decoding.

It is determined whether the binary decoded output converged (i.e., yielded a correct result) (block 452). Where the binary decoded output converged (block 452), the binary decoded output is provided as a data output and another global iteration operating on a subsequent data set begins (block 462). Otherwise, where the binary decoded output failed to converge (block 452), the binary decoded output is stored for future use (block 457). The binary decoded output may be stored, for example, in an unused portion of an output buffer, a central memory buffer, or an input buffer.

The number of binary satisfied checks corresponding to the non-binary decoded output (block 437) is compared with the number of binary unsatisfied checks in the binary decoded output (block 467). Where the number of binary unsatisfied checks corresponding to the non-binary decoded output is greater than the number of binary unsatisfied checks corresponding to the binary decoder output (block 472), the binary decoded output from block 447 is selected as the selected decoding result (block 477). Otherwise, where the number of binary unsatisfied checks corresponding to the non-binary decoded output is less than or equal to the number of binary unsatisfied checks corresponding to the binary decoder output (block 472), the non-binary decoded output from block 417 is selected as the selected decoding result (block 482).

It is then determined whether another local iteration is allowed (block 487). Where another local iteration is allowed (block 487), the processes beginning at block 412 are repeated using the newly selected decoding result. Otherwise, where another local iteration is not allowed (block 487), it is determined whether another global iteration is allowed (block 492). Where another global iteration is not allowed (block 492), an error is indicated and processing on a subsequent data set begins (block 499). Otherwise, where another global iteration is allowed (block 492), the data detection algorithm is applied to the selected delay processing equalized output guided by the selected decoding result to yield an updated detected output (block 497), and the processes beginning at block 402 are re-started for the same data set.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a sample buffer operable to maintain a sample set corresponding to a non-binary codeword;
   a data decoder circuit operable to:
      apply a non-binary data decode algorithm to a decoder input derived from the sample set to yield a non-binary decoded output;
      apply a binary data decode algorithm to the decoder input to yield a binary decoded output;
      determine a first number of unsatisfied checks corresponding to the non-binary decoded output;
      determine a second number of unsatisfied checks corresponding to the binary decoded output;
      select one of the binary decoded output and the non-binary decoded output as a selected decoding result based at least in part on the first number of unsatisfied checks and the second number of unsatisfied checks.

2. The data processing system of claim 1, wherein the non-binary decoded output is a first non-binary decoded output, wherein the binary decoded output is a first binary decoded output, wherein the data decoder circuit is further operable to:
   re-apply the non-binary data decode algorithm to the decoder input guided by the selected decoding result to yield a second non-binary decoded output; and
   re-apply the binary data decode algorithm to the decoder input guided by the selected decoding result to yield a second binary decoded output.

3. The data processing system of claim 1, wherein applying the non-binary data decode algorithm utilizes a non-binary H-matrix, and wherein applying the binary data decode algorithm utilizes a binary H-matrix.

4. The data processing system of claim 3, wherein determining the first number of unsatisfied checks corresponding to the non-binary decoded output comprises:
   multiplying the non-binary decoded output by the binary H-matrix to yield a binary equivalent.

5. The data processing system of claim 1, wherein each symbol in the non-binary codeword represents $2^N$ patterns, wherein N is the non-zero number of bits per symbol; and wherein applying the binary data decode algorithm includes treating the non-binary codeword as having single bit symbols.

6. The data processing system of claim 1, wherein the binary decoded output is selected when the second number of unsatisfied checks is less than the first number of unsatisfied checks.

7. The data processing system of claim 1, wherein the non-binary decoded output is selected when the first number of unsatisfied checks is less than the second number of unsatisfied checks.

8. The data processing system of claim 1, wherein the system further comprises:
   a data detector circuit operable to apply a data detection algorithm to the sample set to yield a detected output, wherein the decoder input is derived from the detected output.

9. The data processing system of claim 8, wherein the data detector circuit is selected from a group consisting of: a Viterbi algorithm data detector circuit, and a maximum a posteriori data detector circuit.

10. The data processing system of claim 1, wherein the data decoder circuit is a low density parity check circuit.

11. The data processing system of claim 1, wherein the data processing system is implemented as part of a device selected from a group consisting of: a storage device and a receiving device.

12. The data processing system of claim 1, wherein the data processing system is implemented as part of an integrated circuit.

13. A method, the method comprising:
   applying a non-binary data decode algorithm to a decoder input to yield a non-binary decoded output;
   applying a binary data decode algorithm to the decoder input to yield a binary decoded output;
   determining a first number of unsatisfied checks corresponding to the non-binary decoded output;
   determining a second number of unsatisfied checks corresponding to the binary decoded output; and
   selecting one of the binary decoded output and the non-binary decoded output as a selected decoding result based at least in part on the first number of unsatisfied checks and the second number of unsatisfied checks.

14. The method of claim 13, wherein the non-binary decoded output is a first non-binary decoded output, wherein the binary decoded output is a first binary decoded output, wherein the method further comprises:
   re-applying the non-binary data decode algorithm to the decoder input guided by the selected decoding result to yield a second non-binary decoded output; and
   re-applying the binary data decode algorithm to the decoder input guided by the selected decoding result to yield a second binary decoded output.

15. The method of claim 14, wherein applying the non-binary data decode algorithm utilizes a non-binary H-matrix, and wherein applying the binary data decode algorithm utilizes a binary H-matrix.

16. The method of claim 15, wherein determining the first number of unsatisfied checks corresponding to the non-binary decoded output comprises:
   multiplying the non-binary decoded output by the binary H-matrix to yield a binary equivalent.

17. The method of claim 13, wherein the binary decoded output is selected when the second number of unsatisfied checks is less than the first number of unsatisfied checks; and wherein the non-binary decoded output is selected when the first number of unsatisfied checks is less than the second number of unsatisfied checks.

18. The method of claim 13, wherein the method further comprises:
   applying a data detection algorithm to a sample set to yield a detected output, wherein the decoder input is derived from the detected output.

19. A storage device, the storage device comprising:
   a storage medium;
   a head assembly disposed in relation to the storage medium and operable to provide a sensed signal corresponding to information on the storage medium;
   a read channel circuit including:
      an analog front end circuit operable to provide an analog signal corresponding to the sensed signal;
      an analog to digital converter circuit operable to sample the analog signal to yield a series of digital samples;
      an equalizer circuit operable to equalize the digital samples to yield a sample set;
      a sample buffer operable to maintain the sample set;

a data decoder circuit operable to:
- apply a non-binary data decode algorithm to a decoder input derived from the sample set to yield a non-binary decoded output;
- apply a binary data decode algorithm to the decoder input to yield a binary decoded output;
- determine a first number of unsatisfied checks corresponding to the non-binary decoded output;
- determine a second number of unsatisfied checks corresponding to the binary decoded output;
- select one of the binary decoded output and the non-binary decoded output as a selected decoding result based at least in part on the first number of unsatisfied checks and the second number of unsatisfied checks.

20. The storage device of claim 19, wherein the non-binary decoded output is a first non-binary decoded output, wherein the binary decoded output is a first binary decoded output, wherein the data decoder circuit is further operable to:
- re-apply the non-binary data decode algorithm to the decoder input guided by the selected decoding result to yield a second non-binary decoded output; and
- re-apply the binary data decode algorithm to the decoder input guided by the selected decoding result to yield a second binary decoded output.

* * * * *